(12) United States Patent
Hergt et al.

(10) Patent No.: US 7,486,077 B2
(45) Date of Patent: Feb. 3, 2009

(54) MAGNETIC RESONANCE SYSTEM WITH COUPLING BETWEEN A BASE UNIT AND A LOCAL COIL AT THE PATIENT BED

(75) Inventors: Martin Hergt, Châtelaine (CH); Thomas Kundner, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/954,031

(22) Filed: Dec. 11, 2007

(65) Prior Publication Data

US 2008/0143332 A1 Jun. 19, 2008

(30) Foreign Application Priority Data

Dec. 13, 2006 (DE) .................. 10 2006 058 848

(51) Int. Cl.
*G01V 3/00* (2006.01)
(52) U.S. Cl. ..................... 324/318; 324/322
(58) Field of Classification Search ............. 324/318, 324/322
See application file for complete search history.

(56) References Cited

U.S. PATENT DOCUMENTS

| | | | | |
|---|---|---|---|---|
| 4,573,475 A * | 3/1986 | Dukes et al. | ............... | 600/407 |
| 4,680,549 A | 7/1987 | Tanttu | | |
| 5,969,525 A * | 10/1999 | Van Driel et al. | ........... | 324/318 |
| 6,590,395 B2 | 7/2003 | Reykowski et al. | | |
| 7,173,426 B1 * | 2/2007 | Bulumulla et al. | .......... | 324/318 |
| 7,423,428 B2 * | 9/2008 | Kuhara | ....................... | 324/307 |
| 2008/0180103 A1 * | 7/2008 | Xue et al. | ................... | 324/318 |
| 2008/0197849 A1 * | 8/2008 | Heid et al. | .................. | 324/318 |

FOREIGN PATENT DOCUMENTS

EP 0 437 049 A2 12/1990

* cited by examiner

*Primary Examiner*—Louis M Arana
(74) *Attorney, Agent, or Firm*—Schiff Hardin LLP

(57) ABSTRACT

A magnetic resonance system has a base unit and a patient bed. The base unit embodies a magnet system by which magnetic fields can be generated in an excitation region, these magnetic fields causing nuclear spins in an examination subject in the excitation region to be excited to emit a magnetic resonance signal. The patient bed can be moved in a travel direction relative to the base body over a travel range. By movement of the patient bed the examination subject can be brought into the excitation region. A number of base unit coupling elements that are connected with an evaluation device for evaluation of magnetic resonance signals are arranged to be stationary at the base unit relative to the base unit. A number of patient bed coupling elements that are connected with a local coil for acquisition of the magnetic resonance signal are arranged on the patient bed so as to be stationary relative to the patient bed. The base unit coupling elements and the patient bed coupling elements are arranged and fashioned such that the magnetic resonance signal acquired by the local coil can be fed via the patient bed coupling elements and the base unit coupling elements to the evaluation device when and as long as the patient bed has moved by a predetermined segment of the travel range. A degree of coupling with which the patient bed coupling elements and the base unit coupling elements and coupled with one another in total is constant within the segment of the travel range.

8 Claims, 7 Drawing Sheets

MAGNETIC RESONANCE SYSTEM WITH COUPLING BETWEEN A BASE UNIT AND A LOCAL COIL AT THE PATIENT BED

BACKGROUND OF THE INVENTION

1. Field of the Invention

The present invention concerns a magnetic resonance system of the type having a base unit and a patient bed, wherein the base unit embodies a magnet system with which magnetic fields are generated in an excitation region, that cause nuclear spins in an examination subject moved into the excitation region to be excited so as to emit a magnetic resonance signal, and wherein the patient bed can be moved in a travel direction relative to the base unit through a travel range, such that the examination subject on the patient bed can be brought into the excitation region by movement of the patient bed.

2. Description of the Prior Art and Related Subject Matter

Magnetic resonance systems of the above type are generally known.

Conventionally, the acquisition of the magnetic resonance signals emitted from the examination subject ensues either with a whole-body antenna or with local coils. If the magnetic resonance signal is acquired with a whole-body antenna, the magnetic resonance signal can be acquired from the entire excitation region. The acquisition is possible, only with relatively low spatial resolution and with a relatively low signal-to-noise ratio (SNR). Therefore in many cases local coils are also used in magnetic resonance systems, often even a number of local coils. The local coils are arranged near to the examination subject (normally a person) and therefore can receive with good SNR, if only from a small portion of the excitation region. Due to the spatial resolution, the spatial coding with gradient fields can be expanded by the arrangement of the local coils. The measurement time for an acquisition (scan) can thus also be reduced.

In order to be able to utilize the advantages of local coils for imaging of the entire body of a person from head to foot, a large number of local coils is required that are placed on the patient in a number of planes arranged along the travel direction of the patient bed. These planes are often designated as levels.

The excitation region typically exhibits a length of approximately 40 to 60 cm as viewed in the travel direction. Thus, only a portion of the body of the person can be imaged at a time, namely the portion that is located in the excitation region. For this reason the patient bed with the patient located thereupon must be moved incrementally through the excitation region. The local coils located in the excitation region must respectively be activated and be connected with an evaluation device for evaluation of magnetic resonance signals. The other local coils can be deactivated. It is thereby possible to manage with a relatively low number of reception channels even though many local coils are present.

In magnetic resonance systems of the prior art the aforementioned problem is achieved by all local coils being connected by a corresponding number of plugs attached at the patient bed and a movable cable harness to an evaluation device that is arranged at the base body. Due to the attenuation of the long, thin cables that are used, pre-amplifiers must be arranged in the local coils. Each local coil must furthermore have a detuning circuit in order to be able to deactivated given non-usage and given transmission. Complicated common mode chokes (known as sheath wave barriers) must also be inserted into the long cable harness in order to be able to limit induced voltages in transmission.

For the back region of the patient it is possible to arrange the acquisition array in a fixed manner under the movable patient bed in the excitation region. In this case the number of these local coils must only be sufficient for the excitation region. Thus for imaging the back region of the patient, it is possible to save many local coils as well as, their cabling and channel selection. The distance from the examination subject is increased only by the relatively slight thickness of the patient bed itself, which is for the most part quite tolerable.

By contrast, this procedure cannot be realized, or can just barely be realized, on the top side of the examination subject because the thicknesses of the patient and the various body regions of the patient are very different. Primarily for thin patients or, for example, at the head or legs, an acquisition coil array permanently installed in the excitation region would be far removed from the body surface, such that the advantage of the local coils (namely a high spatial resolution and a good SNR) would be lost.

A plug connection for local coils that operates without contact (namely by inductive coupling) is already known from DE 101 30 615 C2. This teaching already represents an advance since a galvanic contact between the local coil and the evaluation device is no longer required for coupling the local coil to the evaluation device. However, as before the requirement of an active plugging of the connection by operating personnel exists. The local coil must also be manually connected to the evaluation device or separated from it.

From DE 35 00 456 C2 it is known to couple a local coil with the whole-body antenna. Here a contactless coupling is in fact realized, but, this coupling is only possible for a single coil, and even that only given a suitable orientation of the local coil. The teaching of DE 35 00 456 C2 thus cannot be extended to a number of local coils. Here as well the local coil must be actively connected to the whole-body antenna or be separated from it.

From EP 0 437 049 A2 it is known to directly, inductively couple one local coil to another coil that is arranged in the immediate proximity of the local coil. In this arrangement as well the local coil must be actively connected to the evaluation device or disconnected from it.

A magnetic resonance system of the aforementioned type is likewise described in German patent application 10 2005 056 711.8. In this magnetic resonance system a patient bed coupling element that is connected with a first local coil for acquisition of the magnetic resonance signal is arranged on the patient bed so as to be stationary relative to the patient bed. A number of base unit coupling elements that are connected with an evaluation device for evaluation of magnetic resonance signals are connected at the base unit, and are stationary relative to the base unit. The base unit coupling elements and the patient bed coupling element are arranged and fashioned such that the magnetic resonance signal acquired by the local coil can be fed via the patient bed coupling element and the base unit coupling elements to the evaluation device when and as long as the patient bed is moved by a predetermined segment of the travel range.

The German patent application 10 2005 056 711.8 has not been published as of the priority date of the present invention, and therefore does not represent prior art.

The magnetic resonance system described in the German patent application 10 2005 056 711.8 operates quite well, and allows a local coil to be automatically coupled to an evaluation device when it is located in the excitation region, and is otherwise forcibly decoupled from the evaluation device.

In the embodiment of the German patent application 10 2005 056 711.8, the degree of coupling with which the patient bed coupling element and the base unit coupling element are coupled with one another overall varies with the travel path by which the patient bed is moved within the segment of the travel range.

SUMMARY OF THE INVENTION

An object of the present invention is to further develop a magnetic resonance system of the type described in the German patent application 10 2005 056 711.8, such that a more uniform coupling of the first local coil with the evaluation device is achieved.

This object is achieved by a magnetic resonance system according to the invention, having a number of patient bed coupling elements that are connected with a local coil for acquisition of the magnetic resonance signal, arranged on the patient bed so as to be stationary relative to the patient bed. The base unit coupling elements and the patient bed coupling elements are arranged and fashioned such that the magnetic resonance signal acquired by the local coil can be fed via the patient bed coupling elements and the base units coupling elements to the evaluation device when and as long as the patient bed has moved by a predetermined first segment of the travel range. The degree of coupling with which the patient bed coupling elements and the base unit coupling elements are coupled with one another in total is constant within the segment of the travel range.

Advantageously, not only a single local coil is present but rather a number of local coils, thus at least one second local coil in addition to the aforementioned first local coil. In this case a number of second patient bed coupling elements that are connected with the second local coil are arranged at the patient bed so as to be stationary relative to the patient bed. The second patient bed coupling elements are arranged and fashioned such that the magnetic resonance examination signal acquired by the second local coil can be fed via the second patient bed coupling elements and the base unit coupling elements to the evaluation device when and as long as the patient bed has moved by a predetermined second segment of the travel range. A second degree of coupling with which the second patient bed coupling elements and the base unit coupling elements couple with one another in total is constant within the second segment of the travel range.

The first and the second segments of the travel range can be discrete, thus can be spaced from one another or only border one another. However, the predetermined first segment and the predetermined second segment advantageously overlap one another in an overlap region. The first segment and the second segment can be equally large and the overlap region can be more than half as large as the first segment.

The base unit coupling elements and the patient bed coupling elements are advantageously arranged and fashioned such that, independent of the travel path of the travel range the patient bed is moved at a specific point in time, each of the base units coupling elements respectively couples with a maximum of one of the patient bed coupling elements at this point in time. By this measure the crosstalk of the individual local coils among one another can be reduced or eliminated. In this case it is possible for the evaluation device to dynamically group the base body coupling elements into transmission channels dependent on the travel path of the patient bed. and associates the transmission channels with the local coils on a one-to-one basis.

The coupling elements (thus the base unit coupling elements and the first patient bed coupling elements, possibly also second patient bed coupling elements) can alternatively be fashioned as inductive coupling elements or as capacitive coupling elements. In both cases a number of advantageous embodiments are possible. Possible advantageous embodiments of the coupling elements are described in detail in the German patent application 10 2005 056 711.8.

DESCRIPTION OF THE PREFERRED EMBODIMENTS

Figure 1:
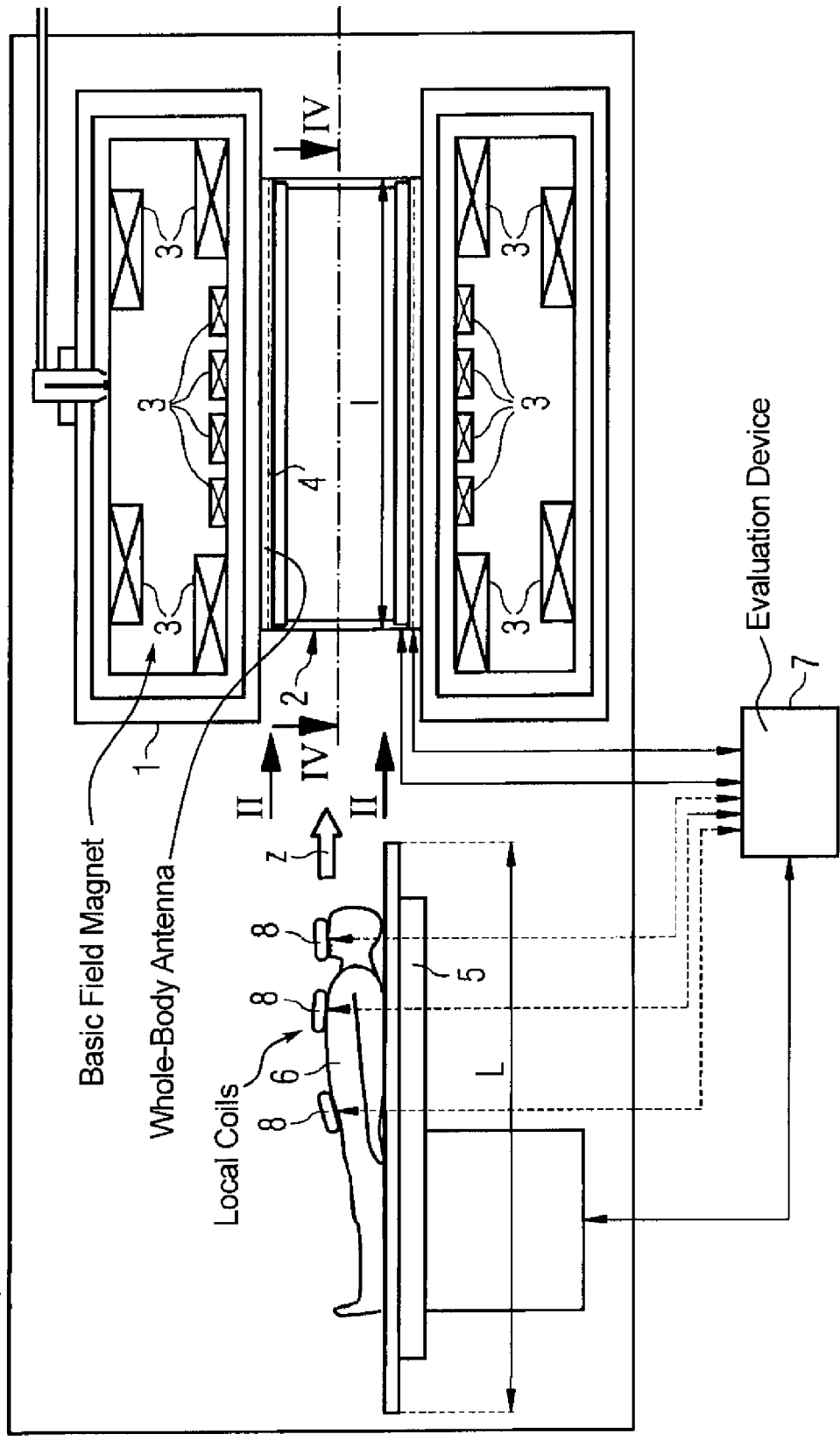
FIG. 1 schematically illustrates a magnetic resonance system.

As shown in FIG. 1, a magnetic resonance system has a base unit 1. The base unit 1 embodies a magnet system by means of which magnetic fields can be generated in an excitation region 2.

The magnet system includes at least one basic field magnet 3 for generation of a temporally static basic magnetic field that is substantially homogeneous within the excitation region 2. The magnetic system furthermore includes a whole-body antenna 4 by means of which a radio-frequency magnetic field can be generated that is substantially homogeneous in the entire excitation region 2. The magnet system normally additionally includes gradient coils (not shown) for generation of gradient fields and a shielding coil (not shown).

The magnetic resonance system according to FIG. 1 has a patient bed 5. The patient bed 5 can be moved in a travel direction z relative to the base unit 1 through a travel range. The travel range is determined such that—as viewed in the travel direction z—each point of the patient bed 5 can be positioned in the excitation region 2. Since the excitation region 2 normally extends over an excitation region length I that is approximately 40 to 60 cm in the travel direction z and the patient bed exhibits a length L on the order of 2 m, the travel range length of the patient bed 5 is thus a multiple of the excitation region length I.

Due to the mobility of the patient bed 5, an examination subject 6 (normally a person 6) can be brought into the excitation region 2 by movement of the patient bed 5 when said examination subject 6 is arranged on the patient bed 5. If the examination subject 6 is introduced into the excitation region 2, nuclear spins therein can be excited to emit a magnetic resonance signal by suitable activation of the magnet system (in particular of the whole-body antenna 4) and generation of suitable magnetic fields corresponding therewith.

It is possible to acquire the emitted magnetic resonance signal by means of the whole-body antenna 4 and to feed it to an evaluation device 7 by which the magnetic resonance signal can be evaluated. However, only a qualitatively low-quality reconstruction of the examination subject 6 is possible in this manner. Local coils 8 that allow a significantly higher-quality magnetic resonance signal to be acquired (although only over a small volume per local coil 8) are therefore normally arranged on the examination subject 6. In contrast to the prior art, the local coils are not connected with the evaluation device 7 via a cable. The lines between the local coils 8 and the evaluation device 7 are therefore indicated only with dashes in FIG. 1. The type and manner of the connection of the local coils 8 to the evaluation device 7 is the subject matter of the present invention.

Figure 2:
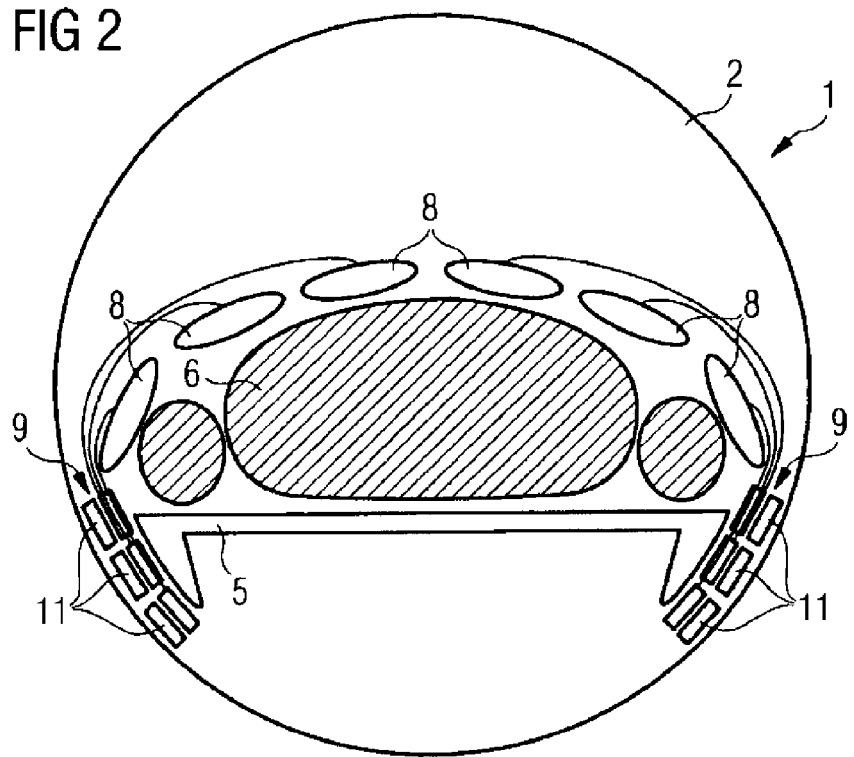
FIG. 2 shows a section through the magnetic resonance system of FIG. 1.
Figure 3:
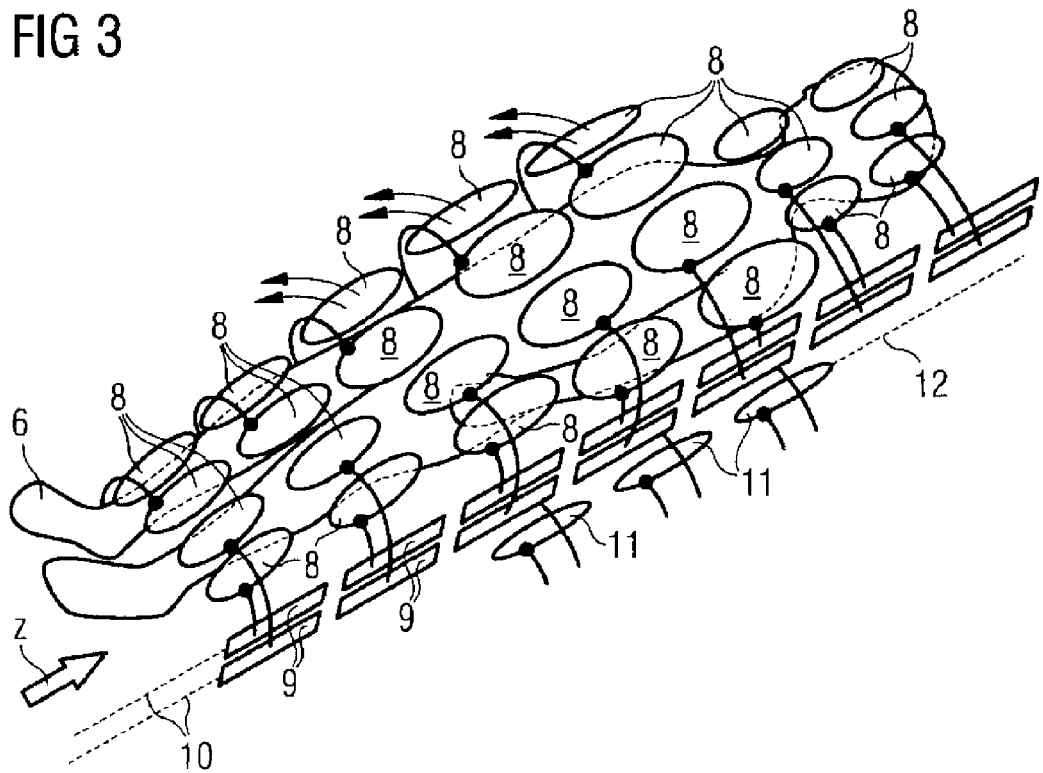
FIG. 3 is a perspective view of a patient bed and base unit coupling elements.

As can be seen from FIG. 1 and more clearly in FIGS. 2 and 3, many local coils 8 are normally arranged on the examination subject 6. Those local coils 8 that are arranged at essentially the same height (as viewed in the travel direction z) thereby respectively form what is known as a level. Depending on the situation of the individual case, the levels can cover the entire body of the examination subject 6.

Each local coil 8 is advantageously connected with at least two patient bed coupling elements 9. By contrast, each patient bed coupling element 9 is connected with only a single local coil 8. Each patient bed coupling element 9 is arranged at a predetermined point of the patient bed 5. These points are subsequently called patient bed points since they are stationary with regard to the patient bed 5.

The patient bed coupling elements 9 are arranged in a number of rows 10 (see in particular FIG. 3). Each row 10 extends in the travel direction z over a length that is at maximum as large as the length L of the patient bed 5. Each row 10 of patient bed coupling elements 9 can therefore extend at maximum over approximately 2 m as viewed in the travel direction z. According to FIG. 4, within each row 10 the patient bed coupling elements 9 follow one another in a grid a. The grid a is typically 8 to 15 cm, in particular 10 to 12 cm. The grid a is normally an integer multiple of a distance b of the patient bed coupling elements 9 from one another, for example two or three times said distance b.

Furthermore, base unit coupling elements 11 that are connected with the evaluation device 7 are arranged at the base unit 1 for connection of the local coils 8 to the evaluation device 7. The base unit coupling elements 11 are arranged at predetermined points of the base unit 1. These points are subsequently called base unit points since they are stationary with regard to the base unit 1.

Figure 4:
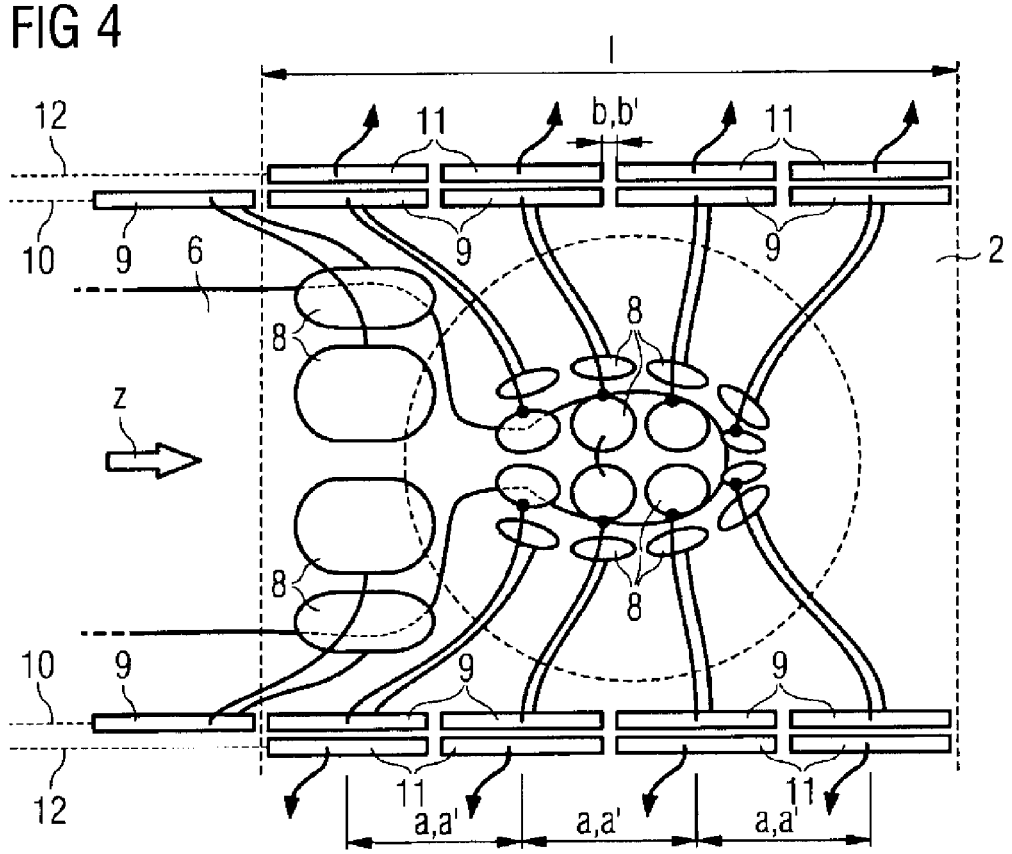
FIG. 4 shows a further section through the magnetic resonance system of FIG. 1.

As is apparent from FIGS. 3 and 4, the base unit coupling elements 11 are also arranged in rows 12. According to FIG. 4, each row 12 of base unit coupling elements 11 likewise extends in the travel direction z, but only over a smaller length than the patient bed 5, namely essentially over the excitation region length I. Each row 12 of base unit coupling elements 11 interacts with one of the rows 10 of patient bed coupling elements 9.

From FIG. 4 it is also apparent that the base unit characteristic lines 11 are arranged in the excitation region 2. Due to the circumstance that a plurality of base unit coupling elements 11 are arranged one after another in the excitation region 2 as viewed in the travel direction z, from FIG. 4 it is thus also apparent that the grid a' of the base unit coupling elements 11 is significantly smaller (as viewed in the travel direction z) than the excitation region length I. The grid a' of the base body coupling elements 11 is generally the same as the grid a of the patient bed coupling elements 9 from one another. The grid a' is advantageously an integer multiple of a distance b' of the base body coupling elements 11 from one another, for example two or three times said distance b'. The distance b' of the base body coupling elements 11 from one another can be the same as the distance b of the patient bed coupling elements 9 from one another.

The arrangement of the rows 10 of patient bed coupling elements 9 and the arrangement of the rows 12 of base unit coupling elements 11 are matched to one another such that the local coils 8 associated with the respective row 10 of patient bed coupling elements 9 can feed the magnetic resonance signals acquired by them to the evaluation device 7 via the patient bed coupling elements 9 of the respective row 10 and the base unit coupling elements 11 of the corresponding row 12 of base unit coupling elements 11. This naturally only applies when the respective patient bed coupling element 9 of a row 10 of patient bed coupling elements 9 is arranged in the active region of one of the base body coupling elements 11 of the corresponding row 12 of base unit coupling elements 11. This is subsequently explained in detail in connection with FIG. 5.

The base unit coupling elements 11 and the patient bed coupling elements 9 are arranged and fashioned such that the magnetic resonance signals acquired by the local coils 8 can be fed to the evaluation device 7 via the patient bed coupling elements 9 and the base unit coupling element 11 when and as long as the patient bed 5 has been moved by a predetermined segment of the travel range. The predetermined segment of the travel range is hereby specific to the respective local coil 8. Degrees of coupling K1, K2, ... with which the patient bed coupling elements 9 of the respective local coil 8 and the base unit coupling elements 11 couple with one another overall are hereby constant within the respective segment of the travel range. The way this can be achieved is subsequently explained in detail in connection with FIG. 5 through 9.

Figure 5:
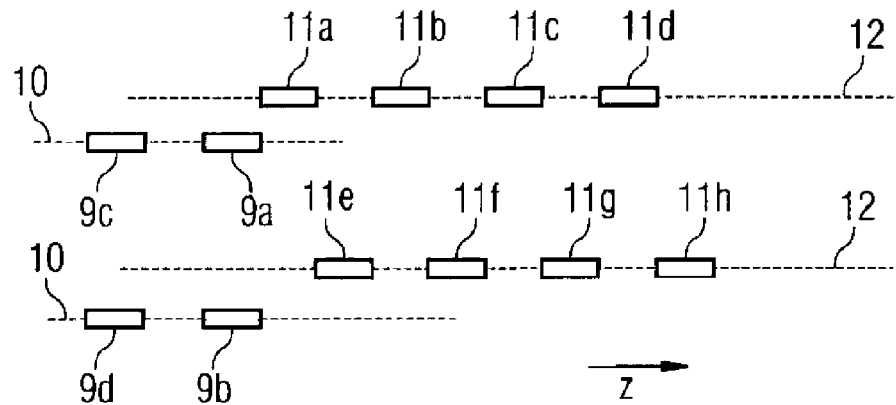
FIGS. 5 through 7 respectively schematically illustrate embodiments of patient bed coupling elements relative to base body coupling elements.
Figure 6:
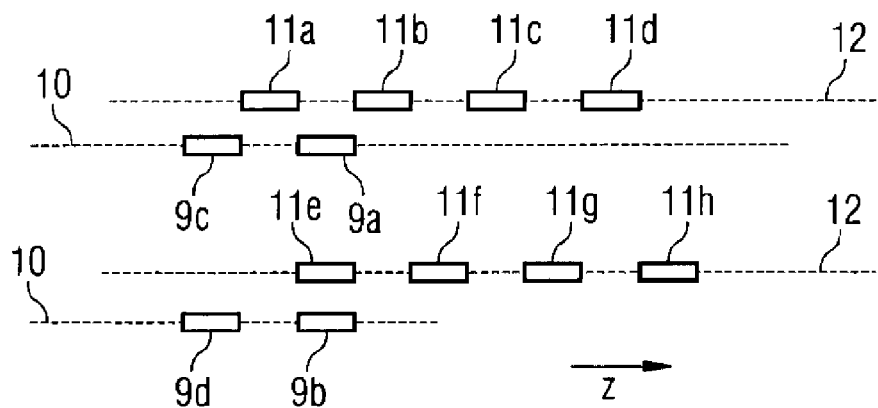
Figure 7:
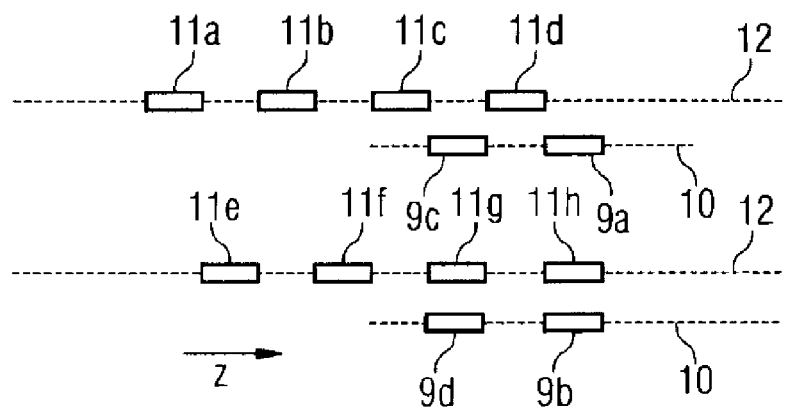

Four patient bed coupling elements 9 are shown in FIG. 5 through 7. The patient bed coupling elements 9 are provided with the reference characters extended by the letters a through d in FIG. 5 through 7 in order to able to linguistically differentiate them from one another. The patient bed coupling elements 9a and 9b are hereby connected with a first of the local coils 8, the patient bed coupling elements 9c and 9d with a second of the local coils 8. Furthermore, two rows 12 of base unit coupling elements 11 are shown in said FIGS. The base unit coupling elements 11 are provided with the reference characters 11 together with the letters a through h in FIG. 5 through 7 in order to be able to differentiate them.

When the patient bed 5 is moved along its travel path, the patient bed 5 at some time reaches a position in which patient bed coupling elements 9a through 9d are located in the position that is shown in FIG. 5. In this position (or at the point in time corresponding with this position), exactly none of the patient bed coupling elements 9a through 9d couple with one of the base unit coupling elements 11a through 11h. However, when the patient bed 5 is moved further starting from the state shown in FIG. 5, an individual degree of coupling kaa (k for degree of coupling, the first a for patient bed coupling element 9a, the second a for base unit coupling element 11a) with which the patient bed coupling element 9a couples with the base unit coupling element 11a rises from zero to a maximum value k1 and then drops again to zero. According to FIG. 8, the rise and fall of the individual degree of coupling kaa hereby defines (at least approximately) an isosceles triangle.

When the individual degree of coupling kaa has dropped to zero, the patient bed coupling elements 9a through 9d are located in the position that is shown in FIG. 6. In this position the base body coupling element 9a no longer couples with the base unit coupling element 11a and also does not couple with the base unit coupling element 11b. When the base unit 5 is moved further, a next individual degree of coupling kab therefore increases from zero to a maximum value k1 and then falls again to zero.

The base unit coupling elements 11a through 11h are fashioned identically. The triangle defined by the individual degree of coupling kab therefore corresponds to the triangle defined by the individual degree of coupling kaa except for the displacement in the travel direction z.

Given further movement of the patient bed 5, individual degrees of coupling kac and kad with which the patient bed coupling element 9a couples with base unit coupling elements 11c and 11d rise from zero to the maximum value k1 and fall again to zero in an analogous manner. This applies until the patient bed 5 has reached a position that corresponds to the arrangement shown in FIG. 7 of the patient bed coupling elements 9a through 9d relative to the base unit coupling elements 11a through 11h.

As is apparent from FIG. 5 through 7, the patient bed coupling elements 9a and 9b and the base unit coupling elements 11a through 11h are arranged such that the patient bed coupling element 9b always stands precisely opposite one of the base unit coupling elements 11e through 11h (thus maximally couples with the base unit coupling element 11e through 11h situated opposite it at this point in time) when the patient bed coupling element 9a is located between two base unit coupling elements 11a through 11d (thus does not precisely couple with one of the base unit coupling elements 11a through 11d). This applies exactly the same in reverse. The corresponding individual degrees of coupling kbe through kbh are likewise charted in FIG. 8. A total degree of coupling K1 with which the patient bed coupling elements 9a and 9b of the first local coil 8 couple in total with the base body coupling elements 11a through 11h (thus the sum of the individual degrees of coupling kaa through kad and kbe through kbh) from the point in time at which the individual degree of coupling kaa reaches its maximum value k1 up to the point in time at which the individual degree of coupling kbh reaches its maximum value k1 is obviously constant.

The number of the base unit coupling elements 11 per row 12 is normally relatively large, for example 5, 8, 10 or greater. Boundary regions in which the total degree of coupling K1 rises or falls can therefore be disregarded.

The grid measure a with which the patient bed coupling elements 9c and 9d are offset relative to the patient bed coupling elements 9a and 9b normally corresponds to the grid measure a' with which the base unit coupling elements 11a through 11d or 11e through 11h are offset from one another. Analogous to the degrees of coupling kaa through kad and kbe through kbh that, in the first segment, add up to form a constant total degree of coupling K1, individual degrees of coupling kca through kcd and kde through kdh with which the patient bed coupling elements 9c and 9d successively couple with the base unit coupling elements 11a through 11h therefore add up corresponding to FIG. 9 to form a constant total degree of coupling K2 in the second segment of the travel range.

The length I of the first and second segments is equally large. It is essentially determined by the number of the base unit coupling elements 11 per row 12 and the grid measure a' of the base unit coupling elements 11. The length I of the first and second segments results in $$I = (2n-1) \cdot a'/2$$

The second segment exhibits an offset relative to the first segment. The offset corresponds to the grid measure a of the patient bed coupling elements 9. The first segment and the second segment therefore overlap in an overlap region whose length I' results in $$l = n - a.$$
$$V = \frac{n-}{n-} \cdot \frac{a}{a}$$

therefore results for the ratio V of the length I' of the overlap region relative to the length I of the first segment.

Since the number n of base unit coupling elements 11 per row 12 is normally greater than 2 (for example 5 or 10 or—as shown in FIG. 5 through 7—at least 4) and the grid measures a, a' are equal, the ratio V is normally greater than ½. For example, V yields ⅗=0.6 for n=3, 5/7≅0.7 for n=4 and 7/9≅0.8 for n=5.

Figure 8:
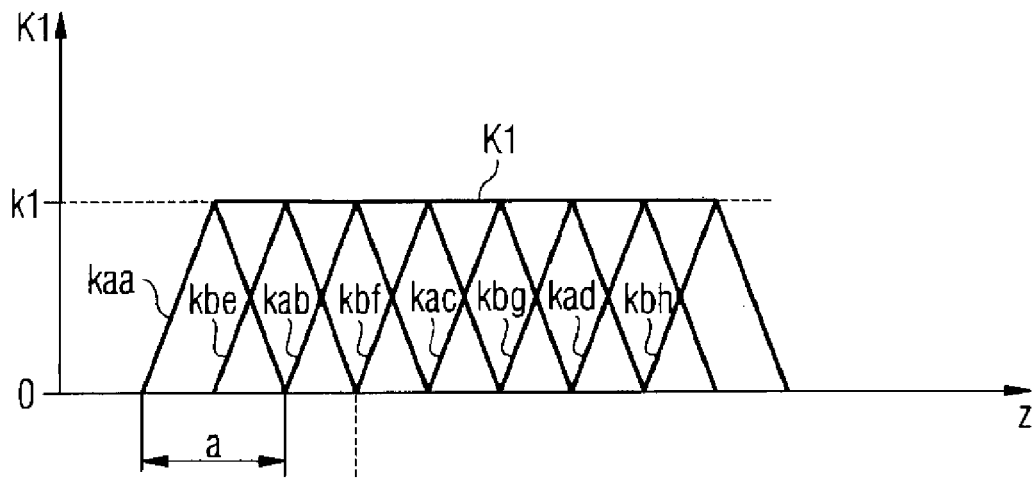
FIGS. 8 and 9 show degrees of coupling of patient bed coupling elements with base unit coupling elements.
Figure 9:
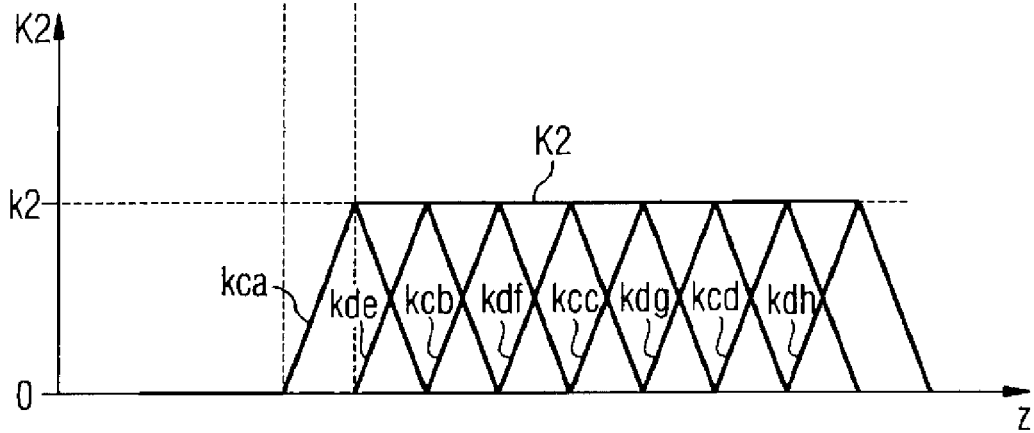

From the representation of the individual degrees of coupling kaa through kdh in FIGS. 8 and 9 it is apparent that, independent of by which travel path of the travel range the patient bed 5 is moved at a specific point in time, at this point in time each of the base unit coupling elements 11a through 11g couples either with none of the patient bed coupling elements 9a through 9d or with a single one of the patient bed coupling elements 9a through 9d. A simultaneous coupling of one of the base body coupling elements 11a through 11d with two or more of the patient bed coupling elements 9a through 9d is, on the other hand, provided at no point in time. It is therefore possible without further measures for the evaluation device 7 dynamically to group the base unit coupling elements 11 into transmission channels dependent on the travel path of the patient bed 5 and respectively proprietarily associates the transmission channels with one of the local coils 8. This is subsequently briefly explained in connection with FIG. 10.

Figure 10:
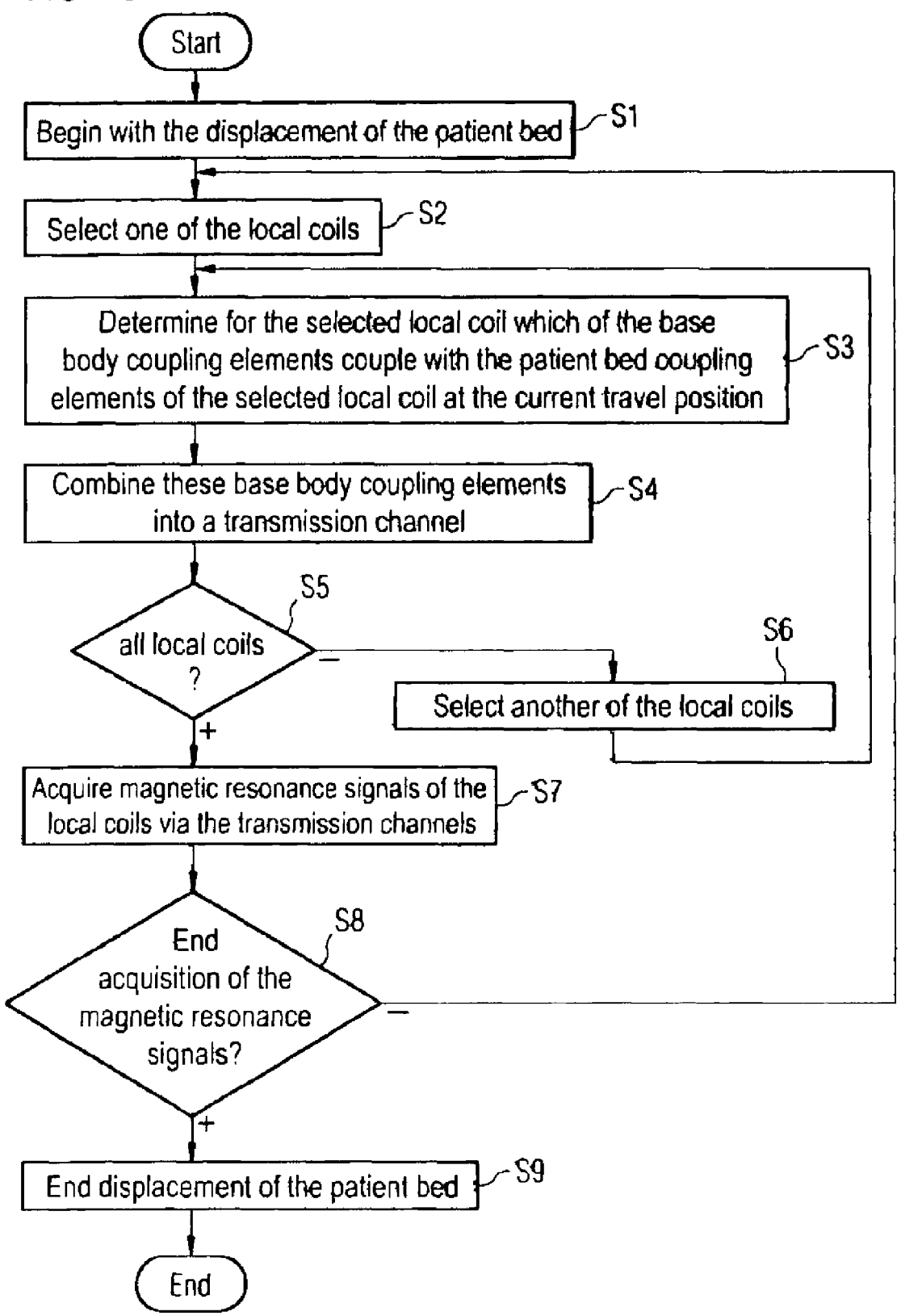
FIG. 10 is a flow chart of an embodiment of the invention.

According to FIG. 10, the displacement of the patient bed 5 begins in a step S1.

The evaluation device selects a first of the local coils 8 in a step S2.

In a step S3 the evaluation device 7 determines for the selected local coil 8 which base unit coupling elements 11 couple with the patient bed coupling elements 9 of the selected local coil 8 at the current travel position. In a step S4 the evaluation device 7 combines these base unit coupling elements 11 into a transmission channel.

In a step S5 the evaluation device 7 checks whether it has already formed a transmission channel for all local coils 8 in question. When this is not the case, the evaluation device 7 transitions to a step S6 in which it selects another of the local coils 8. Starting from the step S6 the evaluation device 7 goes back to the step S3.

By contrast, when a transmission channel has already been defined for all local coils 7 in question, in a step S7 the evaluation device 7 acquires magnetic resonance signals of the local coils 8 via the formed transmission channels.

In a step S8 the evaluation device 7 checks whether the acquisition of the magnetic resonance signals should be ended. When this is not the case, the evaluation device 7 returns to the step S2. Otherwise the evaluation device 7 transitions to step S9 in which it ends the movement of the patient bed 5.

Figure 11:
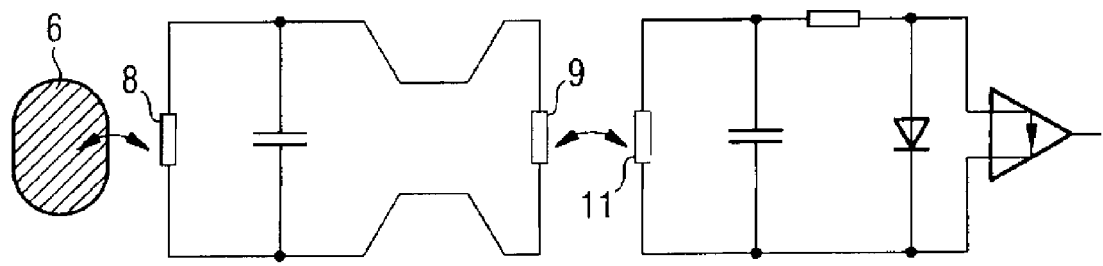
FIGS. 11 and 12 respectively schematically illustrate signal flows from a local coil to an evaluation circuit.
Figure 12:
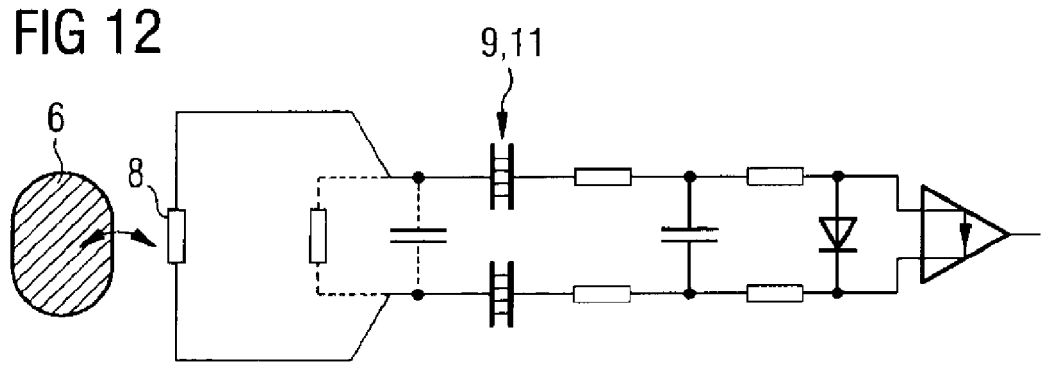

The individual coupling elements 9, 11 can be fashioned as inductive coupling elements 9, 11 (see the schematic FIG. 11). Alternatively, they can be fashioned as capacitive coupling elements 9, 11 (see schematic FIG. 12). However, a uniform embodiment must be present per row 10, 12 of patient bed coupling elements 9 or base unit coupling elements 11. Possible embodiment with inductive coupling elements 9, 11 and capacitive coupling elements 9, 11 are described in detail in the aforementioned German patent application 10 2005 056 711.8.

Figure 13:
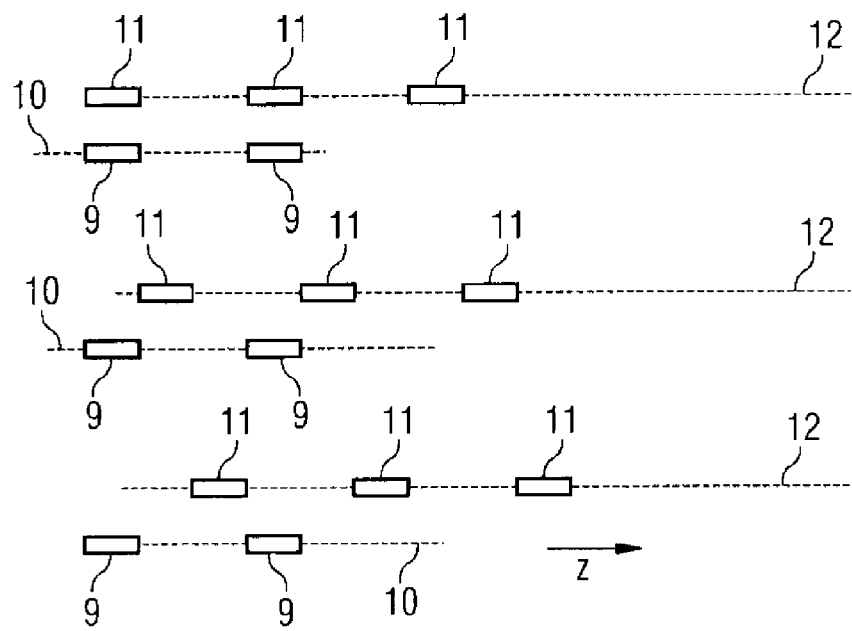
FIG. 13 schematically illustrates a further embodiment of patient bed coupling elements relative to base unit coupling elements.
Figure 14:
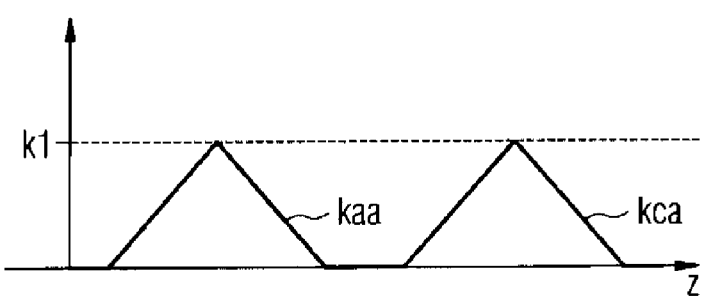
FIG. 14 shows degrees of coupling of patient bed coupling elements with a base unit coupling element.

In the preceding the case was explained that two patient bed coupling elements 9 that couple with two base body coupling elements 11 are present per local coil 8. However, the number of patient bed coupling elements 9 per local coil 8 can alternatively be greater than two. This is schematically shown in FIG. 13 for the case that each local coil 8 is connected with three patient bed coupling elements 9. Corresponding to FIG. 4, this embodiment exhibits the advantage that—with regard to a specific base unit coupling element 11, for example the base unit coupling element 11a—a pause lies between the drop of an individual degree of coupling kaa to zero and the rise of another individual degree of coupling kca of the same base unit coupling element 11. This fact, presented exemplarily in FIG. 14 for the individual degrees of coupling kaa and kca, also applies in an analogous manner for the other individual degrees of coupling. By contrast, normally no such pause remains given only two patient bed coupling elements 9 per local coil 8 that couple with only two base unit coupling elements 11 (see FIGS. 8 and 9).

Figure 15:
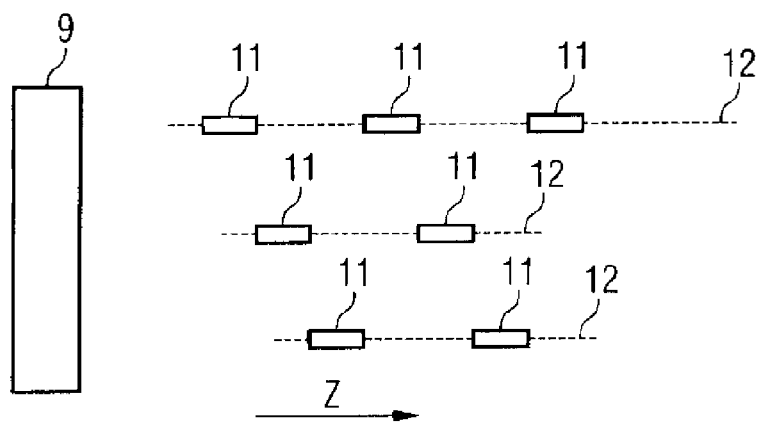
FIG. 15 schematically illustrates a further embodiment of patient bed coupling elements relative to base unit coupling elements.

The simultaneous coupling with a number of base unit coupling elements 11 is absolutely necessary in order to achieve a constant degree of coupling K1, K2. However, it is possible to also achieve such a coupling when only a single patient bed coupling element 9 is present per local coil 8. This is schematically presented in FIG. 15 for a single patient bed coupling element 9 and a plurality of base unit coupling elements 11.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system comprising:
   a magnetic resonance data acquisition base unit configured to receive an examination subject therein, said base unit comprising an excitation region in which nuclear spins are excited in an examination subject to cause emission of a magnetic resonance signal;
   a patient bed configured to receive an examination subject thereon, said patient bed being movable in a travel direction relative to said base unit through a travel range, to bring said examination subject into said excitation region;
   a local coil that acquires said magnetic resonance signal;
   a plurality of patient bed coupling elements that are electrically connected to said local coil, said local coil being stationary relative to said patient bed;
   an evaluation device that evaluates the magnetic resonance signal acquired by said local coil;
   a plurality of base unit coupling elements in communication with said evaluation device, said evaluation device being stationary relative to said base unit; and
   said base unit coupling elements and said patient bed coupling elements being located relative to each other to feed the magnetic resonance signal acquired by the local coil to the evaluation device when, and as long as, said patient bed has moved by a predetermined segment of said travel range, with a degree of coupling between said patient bed coupling elements and said base unit coupling elements, in total, being constant within said segment of said travel range.

2. A magnetic resonance system as claimed in claim 1 wherein said local coil is a first local coil, said patient bed coupling elements are first patient bed coupling elements, said base unit coupling elements are first base unit coupling elements, said segment is a first segment, and said degree of coupling is a first degree of coupling, and comprising a second local coil that is stationary relative to the patient bed, and a plurality of second patient bed coupling elements connected to said second local coil, and a plurality of second base unit coupling elements at said base unit, said second patient bed coupling elements and said second base unit coupling elements being located relative to each other to feed the magnetic resonance signal acquired by said second local coil to said evaluation device when, and as long as, the patient bed has moved by a predetermined second segment of said travel range, with a second degree of coupling between said second patient bed coupling elements and said second base unit coupling elements, in total, being constant within said second segment of said travel range.

3. A magnetic resonance system as claimed in claim 2 wherein said predetermined first segment and said predetermined second segment overlap each other in an overlap region.

4. A magnetic resonance system as claimed in claim 3 wherein said first segment and said second segment are of equal size, and wherein said overlap region is more than half as large as said first segment.

5. A magnetic resonance system as claimed in claim 2 wherein said first and second base unit coupling elements and said first and second patient bed coupling elements are located relative to each other to cause, at any point in time, each of said first and second base unit coupling elements to couple with a maximum of one of said first and second patient bed coupling elements at said point in time, independently of a travel path of the patient bed in said travel range.

6. A magnetic resonance system as claimed in claim 5 wherein said evaluation device dynamically groups said first and second base unit coupling elements into transmission channels respectively dependent on said travel path of said patient bed, and associates the respective transmission channels with one and only one of said first and second local coils.

7. A magnetic resonance system as claimed in claim 1 wherein said patient bed coupling elements and said base unit coupling elements are each inductive coupling elements.

8. A magnetic resonance system as claimed in claim 1 wherein said patient bed coupling elements and said base unit coupling elements are each capacitive coupling elements.

* * * * *